(12) United States Patent
Hamada (10) Patent No.: US 8,851,635 B2
(45) Date of Patent: *Oct. 7, 2014

(54) LIQUID EJECTING HEAD, LIQUID EJECTING APPARATUS, AND PIEZOELECTRIC ELEMENT

(75) Inventor: Yasuaki Hamada, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/038,320

(22) Filed: Mar. 1, 2011

(65) Prior Publication Data

US 2011/0216131 A1 Sep. 8, 2011

(30) Foreign Application Priority Data

Mar. 2, 2010 (JP) .................................. 2010-045973
Jan. 27, 2011 (JP) .................................. 2011-015685

(51) Int. Cl.
| | | |
|---|---|---|
| B41J 2/045 | (2006.01) | |
| H01L 41/08 | (2006.01) | |
| H01L 41/187 | (2006.01) | |
| B41J 2/14 | (2006.01) | |
| H01L 41/318 | (2013.01) | |

(52) U.S. Cl.
CPC ............ *B41J 2/045* (2013.01); *H01L 41/0805* (2013.01); *H01L 41/318* (2013.01); *H01L 41/1878* (2013.01); *B41J 2/14233* (2013.01)
USPC ........................................................ 347/68

(58) Field of Classification Search
None
See application file for complete search history.

(56) References Cited

U.S. PATENT DOCUMENTS

| | | | |
|---|---|---|---|
| 4,755,493 A | 7/1988 | Takeuchi et al. | |
| 4,826,787 A * | 5/1989 | Muto et al. | 228/193 |
| 6,376,090 B1 | 4/2002 | Kijima | |
| 6,626,526 B2 * | 9/2003 | Ueki et al. | 347/72 |
| 6,784,600 B2 | 8/2004 | Klee et al. | |
| 7,524,451 B2 | 4/2009 | Ohashi et al. | |
| 7,710,004 B2 | 5/2010 | Ohashi et al. | |
| 7,727,322 B2 | 6/2010 | Noguchi | |
| 7,901,800 B2 | 3/2011 | Shibata et al. | |
| 8,102,100 B2 | 1/2012 | Hamada et al. | |
| 8,183,594 B2 | 5/2012 | Ishida et al. | |
| 8,395,302 B2 | 3/2013 | Hamada et al. | |
| 2002/0030723 A1 | 3/2002 | Sumi et al. | |
| 2005/0280671 A1 * | 12/2005 | Silverbrook et al. | 347/62 |

(Continued)

FOREIGN PATENT DOCUMENTS

| | | |
|---|---|---|
| CN | 1916229 A | 2/2007 |
| CN | 1931791 A | 3/2007 |

(Continued)

OTHER PUBLICATIONS

Sosnowska et al. "Crystal structure and spiral magnetic ordering of BiFeO3 doped with manganese". Jul. 6, 2001, *Appl. Phys.* A74 (Suppl.), S1040-S1042 (2002).

(Continued)

*Primary Examiner* — Matthew Luu
*Assistant Examiner* — Erica Lin
(74) *Attorney, Agent, or Firm* — Kilpatrick Townsend & Stockton LLP (57) ABSTRACT

There are provided a piezoelectric element comprising a first electrode, a piezoelectric layer and a second electrode, the piezoelectric layer is made of a piezoelectric material that contains a bismuth ferrite and silicon dioxide.

9 Claims, 7 Drawing Sheets

(56) References Cited

U.S. PATENT DOCUMENTS

| | | |
|---|---|---|
| 2006/0222872 A1 | 10/2006 | Higuchi et al. |
| 2007/0241642 A1 | 10/2007 | Miyazawa et al. |
| 2009/0058954 A1 | 3/2009 | Arakawa et al. |
| 2009/0075066 A1 | 3/2009 | Shibata et al. |
| 2009/0230211 A1 | 9/2009 | Kobayashi et al. |
| 2009/0243438 A1 | 10/2009 | Hamada et al. |
| 2011/0298336 A1 | 12/2011 | Saito et al. |

FOREIGN PATENT DOCUMENTS

| | | |
|---|---|---|
| CN | 101393960 A | 3/2009 |
| CN | 101552317 A | 10/2009 |
| JP | 2001-223404 A | 8/2001 |
| JP | 2009252789 A * | 10/2009 |
| JP | 2010-018452 A | 1/2010 |
| WO | 2010/114148 A1 | 10/2010 |

OTHER PUBLICATIONS

Itoh, N., et al. "Fabrication and characterization of BiFeO3-BaTiO3 ceramics by solid state reaction." *Ferroelectrics* 356.1 (2007): 19-23.

Sakamoto, W., et al. "Preparation and Characterization of Perovskite BiFeO3-BaTiO3 Ceramics." *16th International Symposium on Applications of Ferroelectrics 2007*, IEEE, PI, May 1, 2007, pp. 426-427.

Wu, Jiagang, and John Wang. "Improved ferroelectric behavior in (110) oriented BiFeO3 thin films." *Journal of Applied Physics* 107.3 (2010): 034103-2-034103-4.

* cited by examiner

LIQUID EJECTING HEAD, LIQUID EJECTING APPARATUS, AND PIEZOELECTRIC ELEMENT

CROSS-REFERENCE TO RELATED APPLICATIONS

This application claims the benefit of priority to Japanese Patent Application No. 2010-045973 filed Mar. 2, 2010, and Japanese Patent Application No. 2011-015685 filed Jan. 27, 2011 the contents of which are hereby incorporated by reference in their entirety.

BACKGROUND

1. Technical Field

The present invention relates to liquid ejecting heads and liquid ejecting apparatuses. The liquid ejecting head and the liquid ejecting apparatus according to the invention have piezoelectric elements, with which they can eject droplets through nozzle openings they have. Each piezoelectric element has a piezoelectric layer and electrodes formed on this piezoelectric layer. The piezoelectric layer is made of a piezoelectric material.

2. Related Art

A typical form of piezoelectric element is composed of a piezoelectric material having an electromechanical conversion function (e.g., a piezoelectric layer composed of crystals of dielectric materials) and two electrodes sandwiching it. This form of piezoelectric element is used in liquid ejecting heads or similar kinds of devices, serving as flexural-vibration-based actuators. A typical example of liquid ejecting heads is ink jet recording heads. An ink jet recording head has nozzle openings for ejecting ink droplets, and these nozzle openings individually communicate with pressure chambers. These pressure chambers share a diaphragm as one of their components. Piezoelectric elements vibrate to deform some portions of the diaphragm, and then the deformed portions of the diaphragm pressurize appropriate ones of the pressure chambers. As a result, the ink contained in these pressure chambers is ejected in the form of droplets from appropriate ones nozzle openings. A typical method for fabricating piezoelectric elements for this type of liquid ejecting head is as follows: A diaphragm is completely coated with a uniform layer of a piezoelectric material by any kind of film formation method, and then the obtained layer is lithographically cut into smaller pieces fitting pressure chambers.

As in JP-A-2001-223404, lead zirconate titanate (PZT) is often used as a piezoelectric material to fabricate this type of piezoelectric element.

Recently, however, environment-conscious people have called for low-lead piezoelectric materials. An example of lead-free piezoelectric materials is bismuth ferrite ($BiFeO_3$), crystals of which form the perovskite structure (general formula: $ABO_3$). $BiFeO_3$-based piezoelectric materials can be crystallized at a relatively low temperature owing to their high Curie point and high degree of spontaneous polarization, but they are problematic in other ways; their poor insulation performance often leads to a large amount of leakage current. Note that these problems are not unique to ink jet recording heads and other kinds of liquid ejecting heads; similar problems may be encountered with the fabrication of piezoelectric elements that are used as actuators in other kinds of apparatuses.

SUMMARY

An advantage of aspects of the invention is to provide a liquid ejecting head, a liquid ejecting apparatus, and a piezoelectric element that are friendly to the environment.

An aspect of the invention is a liquid ejecting head equipped with piezoelectric elements each having a piezoelectric layer and a pair of electrodes formed on this piezoelectric layer. The piezoelectric layer is made of a piezoelectric material that contains a perovskite compound and silicon dioxide ($SiO_2$), and the perovskite compound is composed mainly of bismuth ferrite-bismuth manganite ($BiFeO_3$—$BiMnO_3$). Using this piezoelectric material to form the piezoelectric layer allows the piezoelectric elements contained in the resultant liquid ejecting head to have good insulation performance despite the low content of lead.

Preferably, the perovskite compound further contains some form of barium titanate, such as $BaTiO_3$. This allows the piezoelectric elements contained in the resultant liquid ejecting head to have good piezoelectric properties (to offer a high degree of distortion).

Preferably, the content ratio of $BiFeO_3$—$BiMnO_3$ in the perovskite compound is equal to or higher than 60 mol %, and the content ratio of $SiO_2$ in the piezoelectric layer is in the range of 0.5 to 5 mol %, inclusive, relative to the amount of the perovskite compound. This further ensures that the piezoelectric elements contained in the resultant liquid ejecting head are low-lead and highly insulating ones.

Another aspect of the invention is a liquid ejecting apparatus equipped with a piece of the liquid ejecting head according to the aspect described above. This liquid ejecting apparatus is environmentally friendly and has excellent liquid-ejecting performance owing to the liquid ejecting head contained therein. This liquid ejecting head contains, as described above, low-lead and highly insulating piezoelectric elements.

Yet another aspect of the invention is a piezoelectric element that has a piezoelectric layer and a pair of electrodes formed on this piezoelectric layer. The piezoelectric layer is made of a piezoelectric material that contains a perovskite compound and $SiO_2$, and the perovskite compound is composed mainly of $BiFeO_3$—$BiMnO_3$. Using this piezoelectric material to form the piezoelectric layer allows the piezoelectric element to have good insulation performance despite the low content of lead.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiment 1

Figure 1:
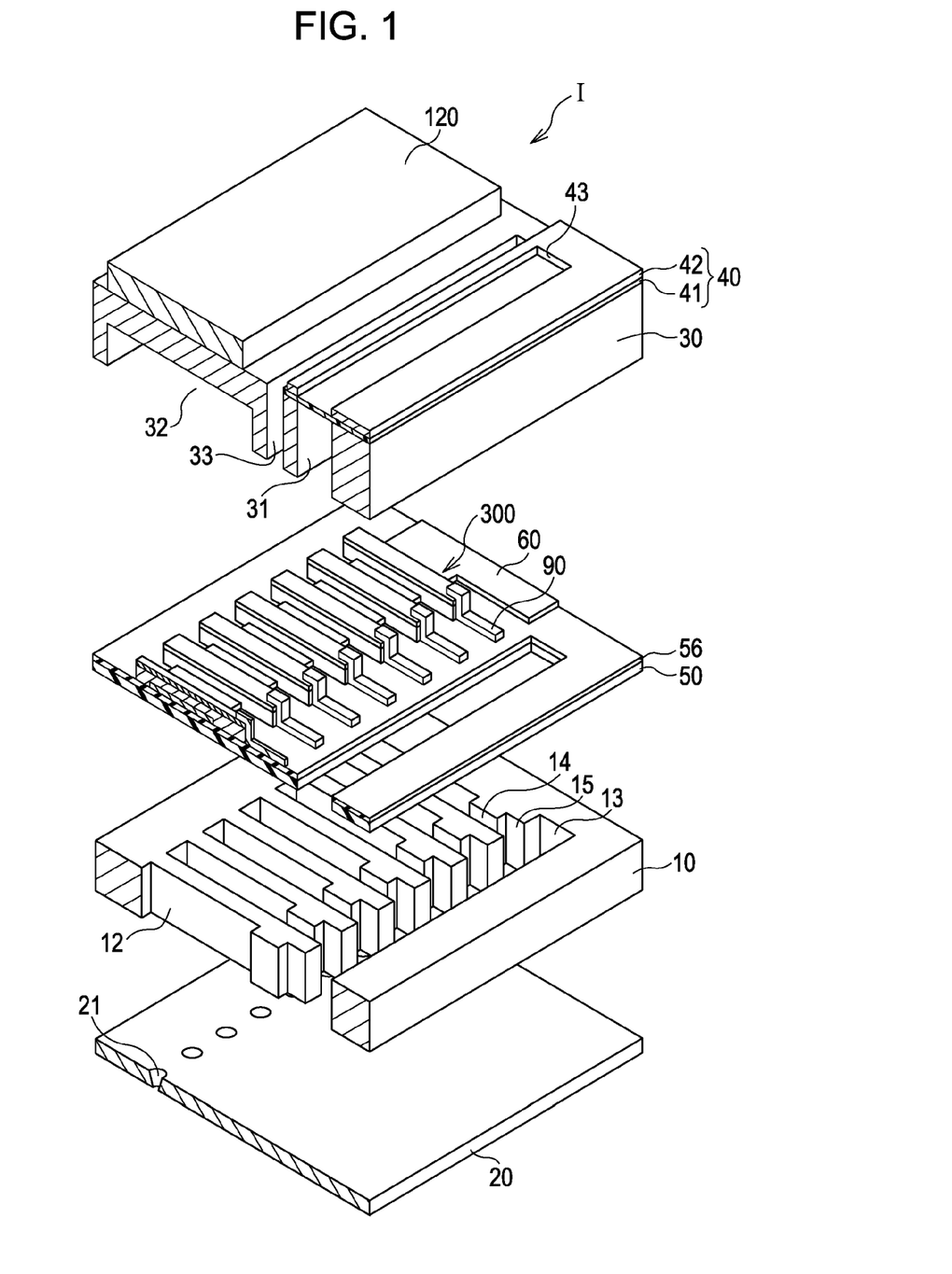
FIG. 1 is an exploded perspective diagram illustrating a recording head according to Embodiment 1.
Figure 2A:
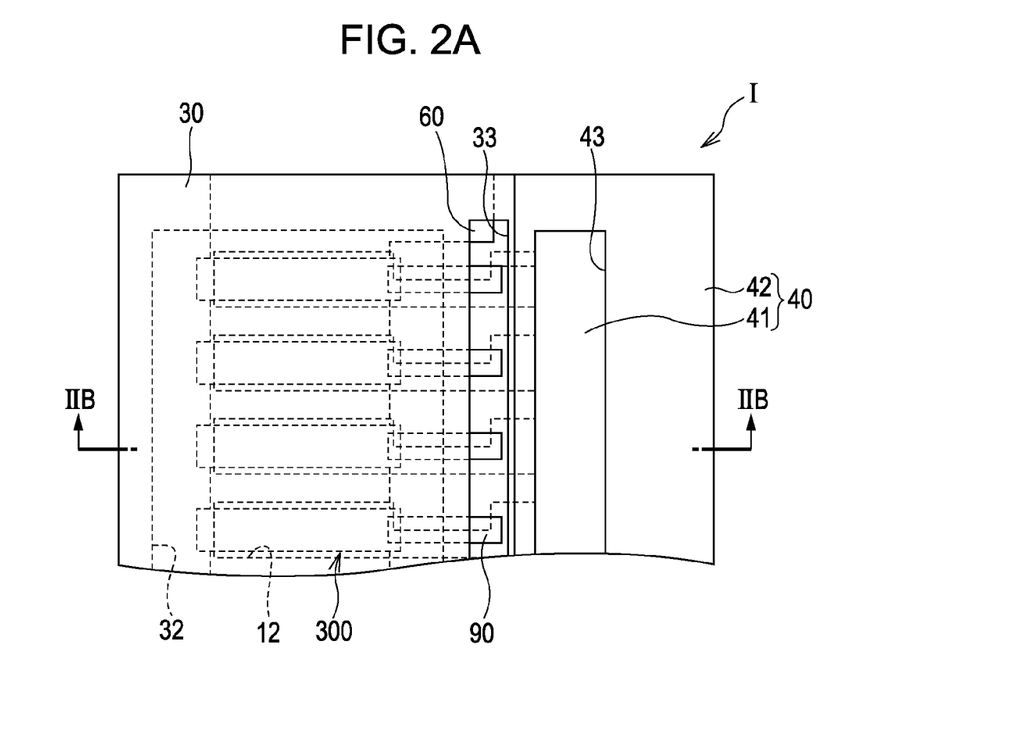
FIGS. 2A and 2B are a plan view and a cross-sectional view of the same recording head.
Figure 2B:
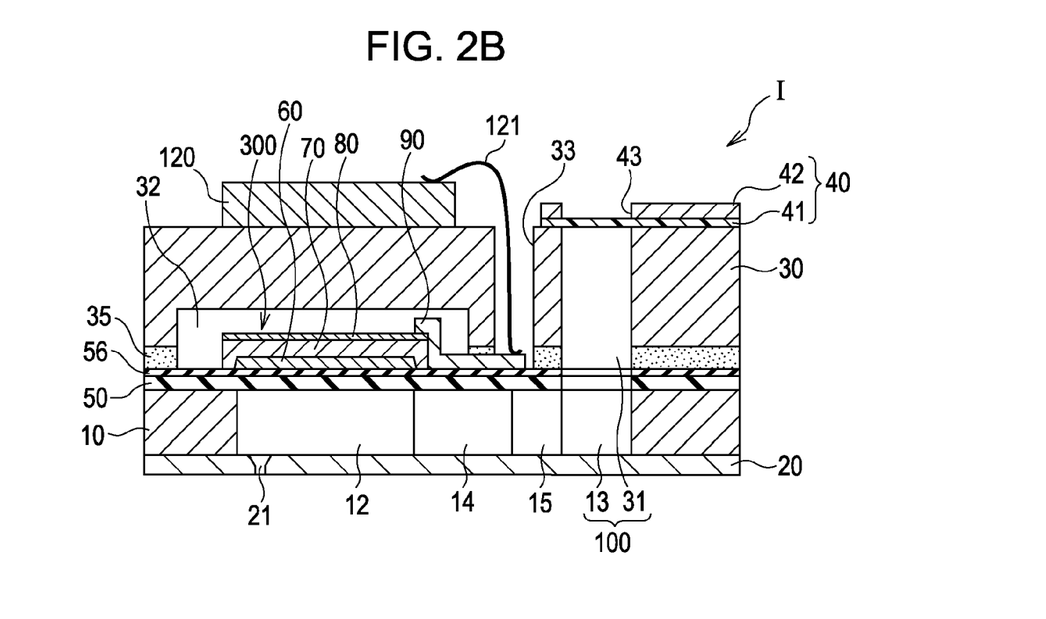

FIG. 1 is an exploded perspective diagram illustrating an ink jet recording head, an example of liquid ejecting heads according to this embodiment. FIGS. 2A and 2B are a plan view and a cross-sectional view along line IIB-IIB of FIG. 1.

As can be seen from FIGS. 1, 2A, and 2B, a flow channel substrate 10 has either one side covered with an elastic film 50. The flow channel substrate 10 is a silicon single crystal substrate, whereas the elastic film 50 is a $SiO_2$ film.

The flow channel substrate 10 has several pressure chambers 12 arranged in parallel. Either one of the regions extending along the ends of the pressure chambers 12 has a communicating space 13, which communicates with the pressure chambers 12 via ink supply paths 14 and communicating paths 15. The communicating space 13 also communicates with a reservoir space 31 of a protective substrate 30 (described later) to serve as a component of a reservoir 100, a common ink tank for the pressure chambers 12. The ink supply paths 14 are narrower than the pressure chambers 12 and regulate the resistance to which ink is exposed when it flows from the communicating space 13 into the pressure chambers 12. In this embodiment, the ink supply paths 14 are formed by making a projection on only one lateral side in each branch of the flow channel; however, they may be formed by making a projection on both lateral sides in each branch of the flow channel or on the top, the bottom, or both in each branch of the flow channel. In summary, the flow channel substrate 10 used in this embodiment has a flow channel defined by the pressure chambers 12, the communicating space 13, the ink supply paths 14, and the communicating paths 15.

The other side of the flow channel substrate 10, namely, the side opposite from the one covered with the elastic film 50, is bonded to a nozzle plate 20 via an adhesive agent, a hot-melt film, or some other adhesive material. The nozzle plate 20 is drilled in advance to have nozzle openings 21, and these nozzle openings 21 individually communicate with the pressure chambers 12 near the ends of the pressure chambers 12 opposite from those having the ink supply paths 14. The nozzle plate 20 may be a glass ceramic substrate, a silicon single crystal substrate, a stainless steel substrate, or some other kind of substrate.

As described above, the flow channel substrate 10 has either one side covered with the elastic film 50. This elastic film 50 is covered with an adhesive layer 56. This adhesive layer 56, which is made of titanium aluminum nitride (TiAlN) or some other appropriate material, mediates the adhesion between a first electrode 60 (described later) and its base, namely, the elastic film 50. Although in this embodiment TiAlN is used, the material of the adhesive layer 56 may be any other substance compatible with the material and characteristics of the first electrode 60 and its base; candidate materials of the adhesive layer 56 include oxides or nitrides containing titanium, zirconium, and/or aluminum, $SiO_2$, magnesium oxide (MgO), cerium dioxide ($CeO_2$), and so forth. In addition, a zirconium dioxide ($ZrO_2$) film or some other kind of insulating film may be inserted between the elastic film 50 and the adhesive layer 56, if necessary.

The adhesive layer 56 has piezoelectric elements 300 built thereon. Each piezoelectric element 300 is a laminate of the first electrode 60, a piezoelectric layer 70, and a second electrode 80. The piezoelectric layer 70 is a thin film having a preferred (e.g., ≥80%) orientation along the (110) plane, and its thickness is usually equal to or smaller than 3 μm and preferably in the range of 0.3 to 1.5 μm. Usually, either one of the first electrode 60 and the second electrode 80 is used as a common electrode for the piezoelectric elements 300, and the other electrode and the piezoelectric layer 70 are patterned to fit the pressure chambers 12. In this embodiment, the first electrode 60 is used as a common electrode for the piezoelectric elements 300, and the second electrode 80 is patterned to provide separate electrodes for the piezoelectric elements 300; however, this assignment may be reversed if the arrangement of a driving circuit or wiring does not permit. Here, each piezoelectric element 300 and a portion (on a diaphragm) that is displaced upon the activation of the piezoelectric element 300 may be collectively referred to as an actuator. In this embodiment, the diaphragm is composed of the elastic film 50, the adhesive layer 56, and the first electrode 60 (and optionally the insulating film mentioned above); however, the constitution of the diaphragm is never limited to this, of course. For example, the elastic film 50, the adhesive layer 56, or both may be omitted, or the piezoelectric elements 300 themselves may serve as the diaphragm.

The piezoelectric layer 70 is made of a piezoelectric material that contains a perovskite compound and $SiO_2$, and this perovskite compound is composed mainly of $BiFeO_3$—$BiMnO_3$. The content ratio of $BiFeO_3$—$BiMnO_3$ is, for example, equal to or higher than 60 mol %. Note that the perovskite compound mentioned here represents any compound crystals of which form the perovskite structure. The perovskite structure can be expressed by the general formula $ABO_3$, where the atom A is in 12-fold coordination of oxygen, and the atom B is in 6-fold coordination of oxygen and surrounded by an octahedron of oxygen atoms. The atom A is bismuth (Bi), but it may be barium (Ba) in some sites if this element is contained. The atom B is iron (Fe) or manganese (Mn), but it may be titanium (Ti) in some sites if this element is contained. $SiO_2$ does not exist in the perovskite compound; in other words, the silicon (Si) atoms contained in it do not take the place of the atom A or B in the perovskite structure. $SiO_2$ seems to exist in the boundaries between the grains of the perovskite compound with its crystallographic form maintained.

Using this piezoelectric material to form the piezoelectric layer 70 allows the piezoelectric elements 300 to have good insulation performance despite the low content of lead, as shown later in the Examples section. This good insulation performance is probably brought about by $SiO_2$ existing in the boundaries between the grains of the perovskite compound and sealing leak paths. Constituted as above, the piezoelectric layer 70 usually has a dielectric constant equal to or higher than 150 at a temperature of 25° C. Containing no low-dielectric layer therein, therefore, the piezoelectric elements 300 have a dielectric constant close to that of the perovskite compound, thereby taking on good piezoelectric properties inherent in the perovskite compound.

Preferably, the perovskite compound contained in the piezoelectric layer 70 further contains some form of barium titanate, such as $BaTiO_3$. Containing this additional perovskite-structured substance therein, the piezoelectric layer 70 attains further improved piezoelectric properties, thereby allowing portions of the diaphragm to deform to a great extent even at low voltage. If barium titanate is used, the piezoelectric layer 70 is made of a perovskite material that contains a perovskite compound containing $BiFeO_3$—$BiMnO_3$ as a major ingredient and barium titanate as a minor ingredient (e.g., in the form of (Bi, Ba) (Fe, Mn, Ti)$O_3$) and $SiO_2$ existing mainly in the boundaries between the grains of this perovskite compound.

The perovskite compound contained in the piezoelectric layer 70 may further contain other perovskite-structured substances, such as $BiZn_{1/2}Ti_{1/2}O_3$, $(Bi_{1/2}K_{1/2})TiO_3$, $(Bi_{1/2}Na_{1/2})TiO_3$, and (Li, Na, K) (Ta, Nb)$O_3$.

There is no particular limitation on the stoichiometry of the major ingredient of the perovskite compound, more specifically, the ratio of the amount of Fe to that of Mn in $BiFeO_3$—$BiMnO_3$. For example, the content ratio of Mn is between 1 mol % and 10 mol %, exclusive, relative to the total molar amount of Fe and Mn. Furthermore, there is no particular limitation on the proportion of BiFeO$_3$—BiMnO$_3$ to SiO$_2$ (and to barium titanate, if this substance is contained). For example, the content ratio of BiFeO$_3$—BiMnO$_3$ is usually equal to or higher than 60 mol % and preferably in the range of 60 to 75 mol % relative to the molar amount of the perovskite compound, namely, the total molar amount of BiFeO$_3$—BiMnO$_3$ and all other perovskite-structured substances (and barium titanate, if this substance is contained). In other words, the total content ratio of the perovskite-structured substances other than BiFeO$_3$—BiMnO$_3$ (this group of substances includes barium titanate if this substance is contained) is usually equal to or lower than 40 mol %. For example, a perovskite compound consisting of BiFeO$_3$—BiMnO$_3$ and BaTiO$_3$ can be expressed by the following general formula:

(1)

where $0.60 \leq x \leq 1$, $0 \leq y \leq 0.40$, $x+y=1$, and $0.01 < a < 0.10$.

Furthermore, there is no particular limitation on the content ratio of SiO$_2$ in the piezoelectric material for forming the piezoelectric layer 70. For example, the content ratio of SiO$_2$ is usually in the range of 0.5 to 5 mol %, inclusive, and preferably in the range of 1.5 to 2.5 mol %, inclusive, relative to the amount of the perovskite compound.

Moreover, there is no particular limitation on the method for forming the piezoelectric elements 300 on the flow channel substrate 10. The following describes a typical method.

First, a flow channel substrate wafer (a silicon wafer) is covered with a SiO$_2$ film or some other similar kind of film to form an elastic film 50. Then, this elastic film 50 is covered with a TiAlN film or some other similar kind of film to form an adhesive layer 56.

Then, a first electrode 60 is formed by sputtering or some other appropriate method to cover the adhesive layer 56. This first electrode 60 is made of platinum, iridium, or iridium oxide, or is a laminate of layers containing these substances. The first electrode 60 is then patterned.

The obtained structure is then covered with a piezoelectric layer 70. There is no particular limitation on the method for forming this piezoelectric layer 70. For example, the piezoelectric layer 70 can be formed by the MOD (metal-organic decomposition) method as follows: A metal compound is dissolved or dispersed in a solvent, the obtained solution or dispersion is applied to give a coating, the obtained coating is dried, and then the dried coating is fired at a high temperature. Other options include chemical-solution-based methods such as sol-gel methods as well as laser ablation, sputtering, pulse laser deposition (PLD), chemical vapor deposition (CVD), aerosol deposition, and so forth.

As for the MOD method, a typical procedure is as follows.

First, a piezoelectric precursor film is formed by coating the first electrode 60 with a precursor solution, namely, a sol or an MOD solution, by spin coating or some other appropriate method (coating process). This precursor solution contains metal compounds and SiO$_2$ in a predetermined proportion to provide an intended content ratio of the perovskite compound to SiO$_2$. Each metal compound contains Bi, Fe, or Mn, or optionally Ba or Ti.

The precursor solution, which is actually in the form of solution or sol, can be obtained by mixing the metal compounds in a predetermined proportion to provide the intended molar content ratios of the metal elements and then dissolving or dispersing the obtained mixture in some kind of alcohol or some other kind of organic solvent. The metal compounds may be in the form of metal alkoxide, organic acid salt, β-diketone complex, or the like. Examples of metal compounds containing Bi are as follows: bismuth benzoate, bismuth oxyacetate, bismuth octylate, bismuth citrate, bismuth acetate, bismuth tri-t-amyloxide, bismuth triethoxide, bismuth tris(dipivaloylmethanate), triphenylbismuth, and bismuth tri-i-propoxide. Examples of metal compounds containing Fe are as follows: iron octylate, iron formate, iron stearate, triethoxy iron, iron tris(acetylacetonate), and iron tri-i-propoxide. Examples of metal compounds containing Mn are as follows: manganese octylate, manganese acetate, and manganese acetylacetonate. Examples of metal compounds containing Ba are as follows: barium benzoate, barium octanoate, barium octylate, barium oleate, barium formate, barium citrate, barium acetate, barium oxalate, barium tartrate, barium diethoxide, barium di-i-butoxide, barium di-n-butoxide, barium di-sec-butoxide, barium di-t-butoxide, barium di-i-propoxide, barium di-n-propoxide, barium dimethoxide, barium hydroxide, barium thiocyanate, barium naphthenate, barium lactate, barium dipivaloylmethanate, barium di(methoxyethoxide), diaquabarium bis(acetylacetonate), barium bis(dipivaloylmethanate), barium propionate, and barium laurate. Examples of metal compounds containing Ti are as follows: titanium octylate, titanium oleate, titanium di(isopropoxy)bis(dipivaloylmethanate), titanium tetraethoxide, titanium tetrakis(diethylamide), titanium tetrakis(dimethylamide), titanium tetra-n-butoxide, titanium tetra-i-butoxide, titanium tetra-sec-butoxide, titanium tetra-t-butoxide, titanium tetra-i-propoxide, titanium tetra-n-propoxide, and titanium tetramethoxide.

The obtained piezoelectric precursor film is then heated at a certain temperature for a certain period of time to dryness (drying process). After that, the dried piezoelectric precursor film is defatted by heating at a certain temperature for a certain period of time (defatting). The term defatting used here represents removing organic substances from the piezoelectric precursor film by converting them into NO$_2$, CO$_2$, H$_2$O, or other chemical species.

The defatted piezoelectric precursor film is then heated to a certain temperature and maintained at this temperature until it is crystallized into a piezoelectric film (firing process). For example, the heating temperature used here is on the order of 600 to 700° C. Examples of heaters that can be used through this series of drying, defatting, and firing processes include RTA (rapid thermal annealing) systems, hot plates, and similar kinds of apparatuses. In RTA systems, the target substance is heated by infrared irradiation.

Note that the piezoelectric layer 70 may be a laminate of several pieces of the piezoelectric film. This laminate can be obtained by repeating the series of coating, drying, and defatting processes and finally performing the firing process, or repeating a set of these four processes until an intended thickness and other necessary characteristics of the films are reached.

Then, the piezoelectric layer 70 is covered with a second electrode 80. This second electrode 80 is made of platinum or some other kind of metal. The second electrode 80 and the piezoelectric layer 70 are then patterned together. In this way, piezoelectric elements 300 are completed.

Post-annealing may follow, if necessary. The temperature for post-annealing is in the range of 600 to 700° C. Post-annealing refines the interface between the piezoelectric layer 70 and the first electrode 60 and that between the piezoelectric layer 70 and the second electrode 80 and also improves the crystallographic properties of the piezoelectric layer 70.

EXAMPLES

The following describes an aspect of the invention with reference to examples. Note that these examples do not limit any aspect of the invention.

Example 1

First, a silicon substrate was thermally oxidized until the thickness of the $SiO_2$ film formed on it reached 400 nm. Then, a TiAlN film was formed on this $SiO_2$ film by radio-frequency (RF) sputtering to have a thickness of 100 nm. Subsequently, an iridium (Ir) film and then an iridium oxide ($IrO_2$) film were formed on this TiAlN film by direct-current (DC) sputtering to have thicknesses of 100 nm and 30 nm, respectively. After that, a platinum (Pt) film having an orientation along the (111) plane was formed on the $IrO_2$ film by vapor deposition. This Pt film was used as the first electrode 60.

Then, the piezoelectric layer 70 was formed on the obtained first electrode 60 by spin coating. A more detailed description of this process is as follows.

First, compounds each containing Bi, Fe, Mn, Ba, Ti, or Si and a solvent were mixed in a predetermined proportion to provide the precursor solution. The total molar concentration of Bi, Fe, Mn, Ba, and Ti was 0.25 mol/L. The obtained precursor solution was then dropped onto the substrate, on which the TiAlN film and the first electrode 60 had been formed in the way described above, and then the substrate was spun at a velocity of 1500 rpm; in this way, a piezoelectric precursor film was obtained (coating process). Subsequently, the substrate was heated at 350° C. for 3 minutes (drying and defatting processes). This series of coating, drying, and defatting processes was repeated three times, and then the substrate was subjected to RTA, or more specifically, fired at 650° C. for 1 minute (firing process). This series of processing (three rounds of coating, drying, and defatting each followed by firing) was repeated four times, and finally the substrate underwent RTA with the firing temperature set at 650° C. and the duration 10 minutes. Formed by twelve times of coating, the resultant piezoelectric layer 70 had a total thickness of 800 nm.

Then, another Pt film was formed on this piezoelectric layer 70 by DC sputtering to have a thickness of 100 nm. This Pt film was used as the second electrode 80. The substrate then underwent RTA with the firing temperature set at 650° C. and the duration 10 minutes; in this way, the piezoelectric element 300 was completed. In the finished structure, the piezoelectric material of the piezoelectric layer 70 was a mixture of a perovskite compound and $SiO_2$, where the perovskite compound had a composition of $0.75Bi(Fe_{0.95}Mn_{0.05})O_3$-$0.25BaTiO_3$ and $SiO_2$ had a content ratio of 2 mol % relative to the amount of this perovskite compound.

Example 2

The piezoelectric element 300 was built in the same way as in Example 1 except that the proportion of the compounds of Bi, Fe, Mn, Ba, Ti, and Si was changed. In the finished piezoelectric element 300, the composition of the perovskite compound was $0.60Bi(Fe_{0.95}Mn_{0.05})O_3$-$0.40BaTiO_3$. The content ratio of $SiO_2$ was 2 mol % relative to the amount of the perovskite compound in this example as well.

Comparative Example 1

The piezoelectric element 300 was built in the same way as in Example 1 except that no Si was contained in the precursor solution. The composition of the perovskite compound in the finished piezoelectric element 300 was $0.75Bi(Fe_{0.95}Mn_{0.05})O_3$-$0.25BaTiO_3$ in this comparative example as well.

Test 1

Figure 3:
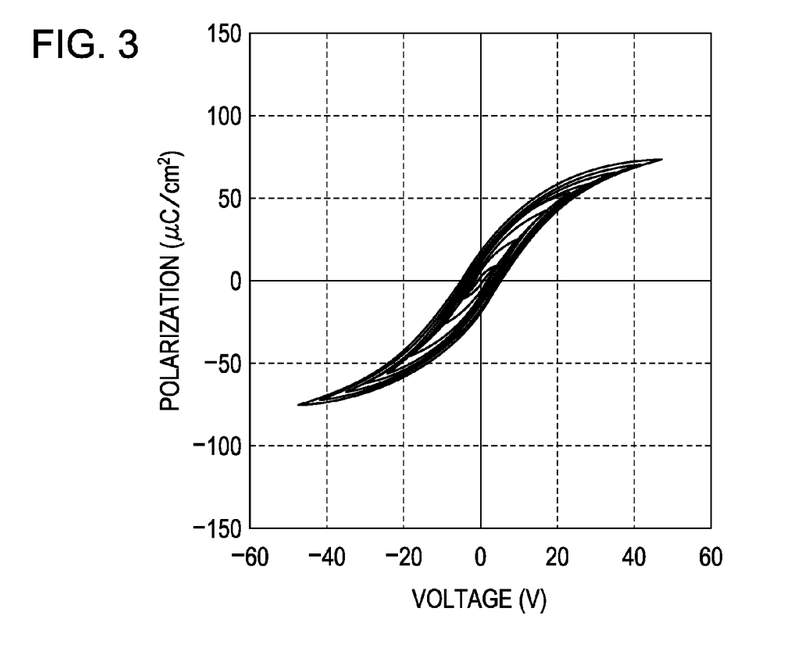
FIGS. 3, 4, and 5 illustrate polarization-voltage (P-V) hysteresis curves for Example 1, Example 2, and Comparative Example 1, respectively.
Figure 4:
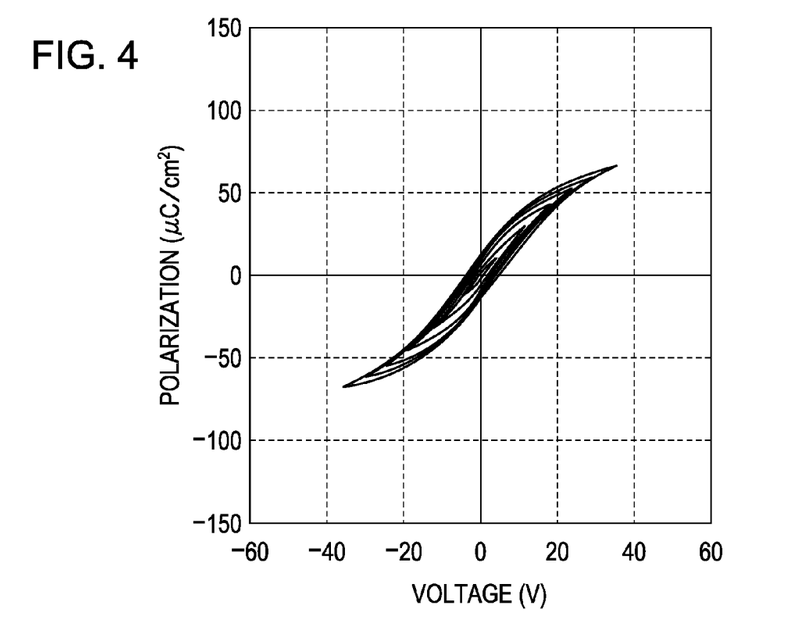
Figure 5:
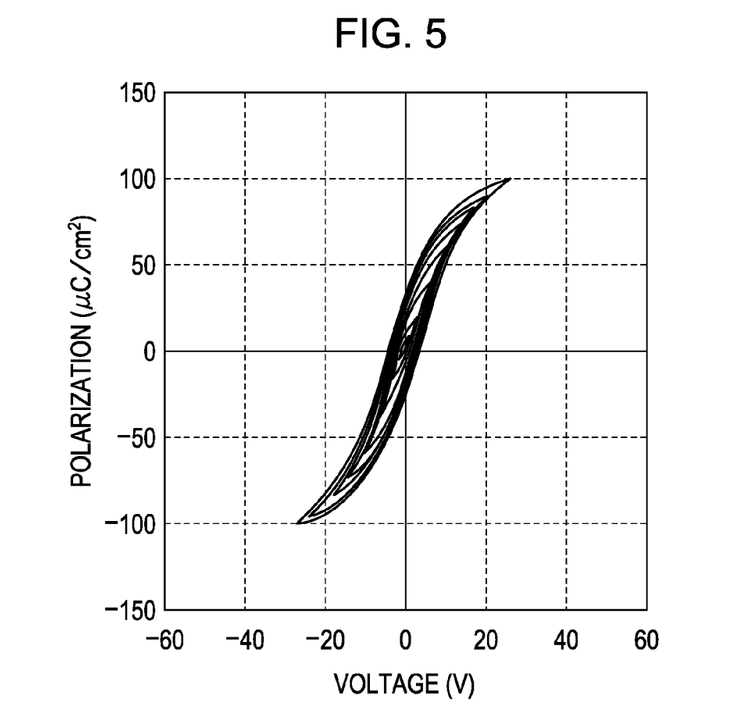

The piezoelectric elements 300 made in Examples 1 and 2 and Comparative Example 1 were exposed to ramp pulses with a frequency of 1 kHz and a voltage in the range of 3 to 60V. The ferroelectric analyzer used was TOYO Corporation FCE-1A, and the electrode pattern used was one having a diameter of 400 μm. FIGS. 3, 4, and 5 illustrate polarization-voltage (P-V) hysteresis curves for Example 1, Example 2, and Comparative Example 1, respectively. As can be seen from these curves, in all of the examples and comparative example tested, the piezoelectric layer 70 was ferroelectric.

Examples 1 and 2 gave favorable hysteresis curves in the voltage ranges up to 51 V and 36 V, respectively, demonstrating an excellent insulating performance of the piezoelectric element 300. On the other hand, Comparative Example 1 gave favorable hysteresis curves in a narrower voltage range, up to 27 V; voltage exceeding this threshold short-circuited the piezoelectric layer 70.

Test 2

Figure 6:
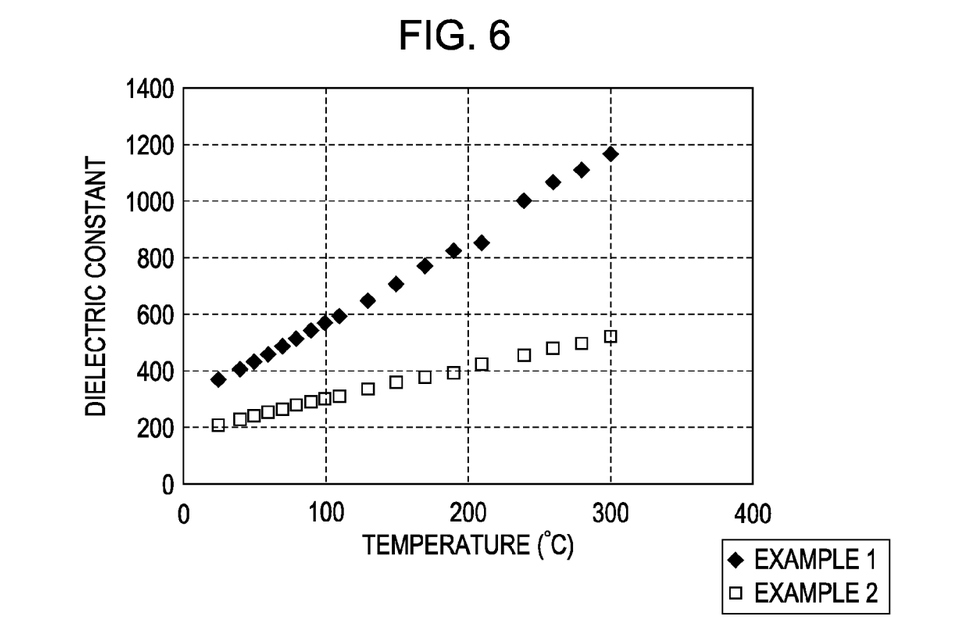
FIG. 6 illustrates plots of dielectric constant versus temperature obtained for Examples 1 and 2.

The piezoelectric elements 300 made in Examples 1 and 2 and Comparative Example 1 were individually set in the Agilent/HP 4294A precision impedance analyzer, and the dielectric constant was measured for each under the following conditions: frequency: 1 kHz; oscillator level: 141 mV; temperature: 25 to 300° C. FIG. 6 illustrates plots of dielectric constant versus temperature obtained for Examples 1 and 2. As can be seen from these plots, in both examples, the dielectric constant of the piezoelectric layer 70 was higher than 200 throughout the temperature range involved.

Test 3

Figure 7:
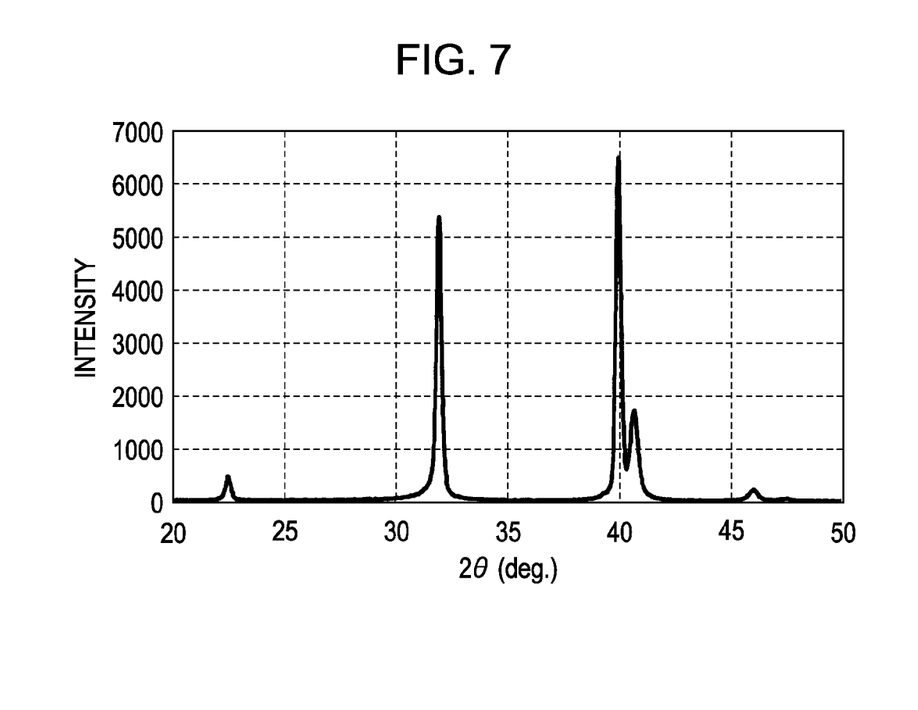
FIGS. 7, 8, and 9 illustrate X-ray diffractometry (XRD) patterns for Example 1, Example 2, and Comparative Example 1, respectively.
Figure 8:
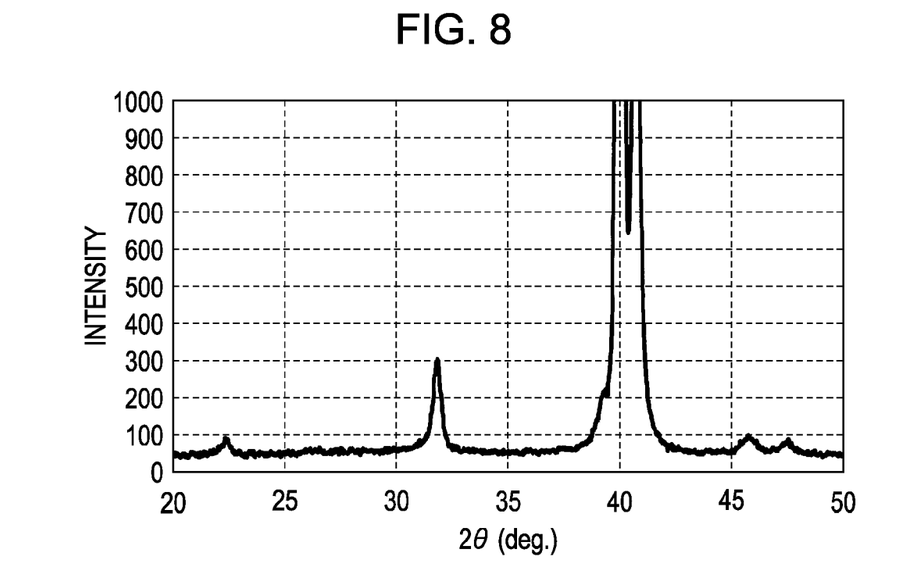
Figure 9:
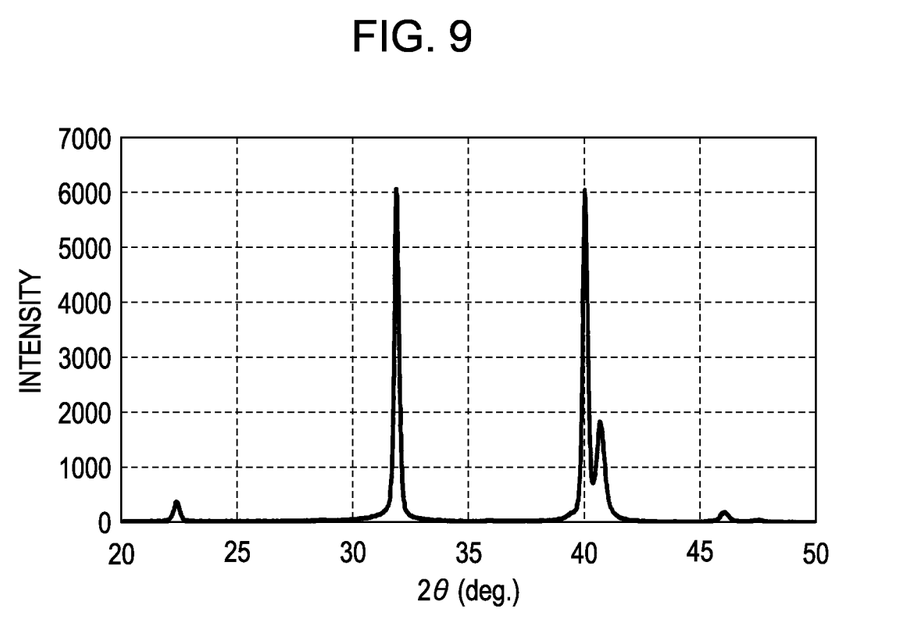

The piezoelectric elements 300 made in Examples 1 and 2 and Comparative Example 1 were individually set in the Bruker AXS D8 Discover X-ray diffractometer, and the powder X-ray diffraction (XRD) pattern of the piezoelectric layer 70 was determined for each under the following conditions: X-ray source: CuKα radiation; temperature: room temperature; angles φ and ψ: 0°. FIGS. 7, 8, and 9 illustrate XRD patterns for Example 1, Example 2, and Comparative Example 1, respectively. As can be seen from these XRD patterns, the perovskite ($ABO_3$) structure was observed in all of the examples and comparative example tested.

Turning back to the description of Embodiment 1, the second electrode 80 is patterned to provide separate electrodes for the piezoelectric elements 300. These separate electrodes are connected to lead electrodes 90. Each lead electrode 90 is made of gold (Au) or some other similar material, and extends from near the closer end of the corresponding separate electrode to the ink supply path 14 and reaches to the adhesive layer 56.

The side of the flow channel substrate 10 having the piezoelectric elements 300 formed thereon, in other words, the side on which the lower electrode 60, the adhesive layer 56, and the lead electrodes 90 are exposed, is covered with a protective substrate 30 bonded thereto via an adhesive agent 35 or some other appropriate material. This protective substrate 30 has a reservoir space 31, a component of a reservoir 100. In this embodiment, this reservoir space 31 is formed through the entire thickness of the protective substrate 30 and in the width direction of the pressure chambers 12. As mentioned above, the reservoir space 31 communicates with the communicating space 13, thereby serving as a component of the reservoir 100. Note that other constitutions of the reservoir 100 may be allowed; for example, the communicating space 13 may be divided to fit the pressure chambers 12 so that the reservoir space 31 can solely serve as the reservoir 100. Another possible constitution is one in which only the pressure chambers 12 are formed in the flow channel substrate 10, and the ink supply paths 14 are formed in the portion between the flow channel substrate 10 and the protective substrate 30 (e.g., the portion consisting of the elastic film 50 and the adhesive layer 56) to allow the communication between the reservoir 100 and the pressure chambers 12.

The protective substrate 30 additionally has a piezoelectric element housing 32 in a portion facing the piezoelectric elements 300. This piezoelectric element housing 32 has a space that is large enough to allow the piezoelectric elements 300 to vibrate, and this space may be a closed system or an open system.

Preferably, this protective substrate 30 is made of any material that has a coefficient of thermal expansion almost equal to that of the flow channel substrate 10, for example, glass, ceramics, or some other similar material. In this embodiment, as with the flow channel substrate 10, the protective substrate 30 is also a silicon single crystal substrate.

Furthermore, the protective substrate 30 has a through-hole 33 formed through the entire thickness. The individual lead electrodes 90, extending from their corresponding piezoelectric elements 300, have a portion exposed in the through-hole 33 near one end.

The protective substrate 30 also has a driving circuit 120 mounted thereon. This driving circuit 120 is for the purpose of driving the piezoelectric elements 300, and it may be a printed circuit board, a semiconductor integrated circuit (IC), or some other appropriate kind of substrate. The driving circuit 120 and the lead electrodes 90 are connected via wiring 121. This wiring 121 is based on conductive wires such as bonding wires.

The protective substrate 30 further has a compliance substrate 40 bonded thereto, and this compliance substrate 40 has a sealing film 41 and a stationary plate 42. The sealing film 41 is made of a flexible material with a low rigidity and seals one opening of the reservoir space 31. The stationary plate 42 is made of a harder material and has an opening 43 formed through the entire thickness over the area corresponding to the reservoir 100. As a result, the reservoir 100 is sealed on one side only with the sealing film 41, a flexible film.

An ink jet recording head I according to this embodiment receives ink from an external ink source (not illustrated in the drawings), fills the entire space from the reservoir 100 to the nozzle openings 21 with the ink, and then, in response to recording signals transmitted from the driving circuit 120, distributes voltage to the first electrode 60 and the second electrode 80 so that the elastic film 50, the adhesive layer 56, the first electrode 60, and the second electrode 80 should be deformed at the positions corresponding to appropriate ones of the pressure chambers 12; as a result, the appropriate ones of pressure chambers 12 are pressurized to eject ink droplets through the corresponding nozzle openings 21.

Other Embodiments

Embodiment 1 described above does not limit the basic constitution of any aspect of the invention. For example, the piezoelectric material of the piezoelectric layer 70 may further contain nickel (Ni), cobalt (Co), chromium (Cr), scandium (Sc), vanadium (V), and/or other elements for more improved piezoelectric properties or for other purposes.

As for the flow channel substrate 10, materials other than silicon single crystals may be allowed. It may be a semiconductor substrate based on germanium (Ge) or some other similar element, a transparent substrate based on crystals of strontium titanium oxide ($SrTiO_3$), indium tin oxide ($InSnO_3$), zinc oxide (ZnO), aluminum oxide ($Al_2O_3$), $SiO_2$, or some other similar compound, a glass substrate, a metal substrate made of stainless steel, titanium, or some other similar material, a silicon-on-insulator (SOI) substrate, or any other appropriate kind of substrate.

Furthermore, the overall structure of each piezoelectric element 300 is not limited to the one described above, namely, a laminate of the first electrode 60, the piezoelectric layer 70, and the second electrode 80 formed on a substrate (the flow channel substrate 10). For example, some aspects of the invention can be applied to longitudinal-vibration piezoelectric elements, in which piezoelectric materials and electrode materials are alternately layered and these layers are expanded and contracted in the longitudinal direction.

Figure 10:
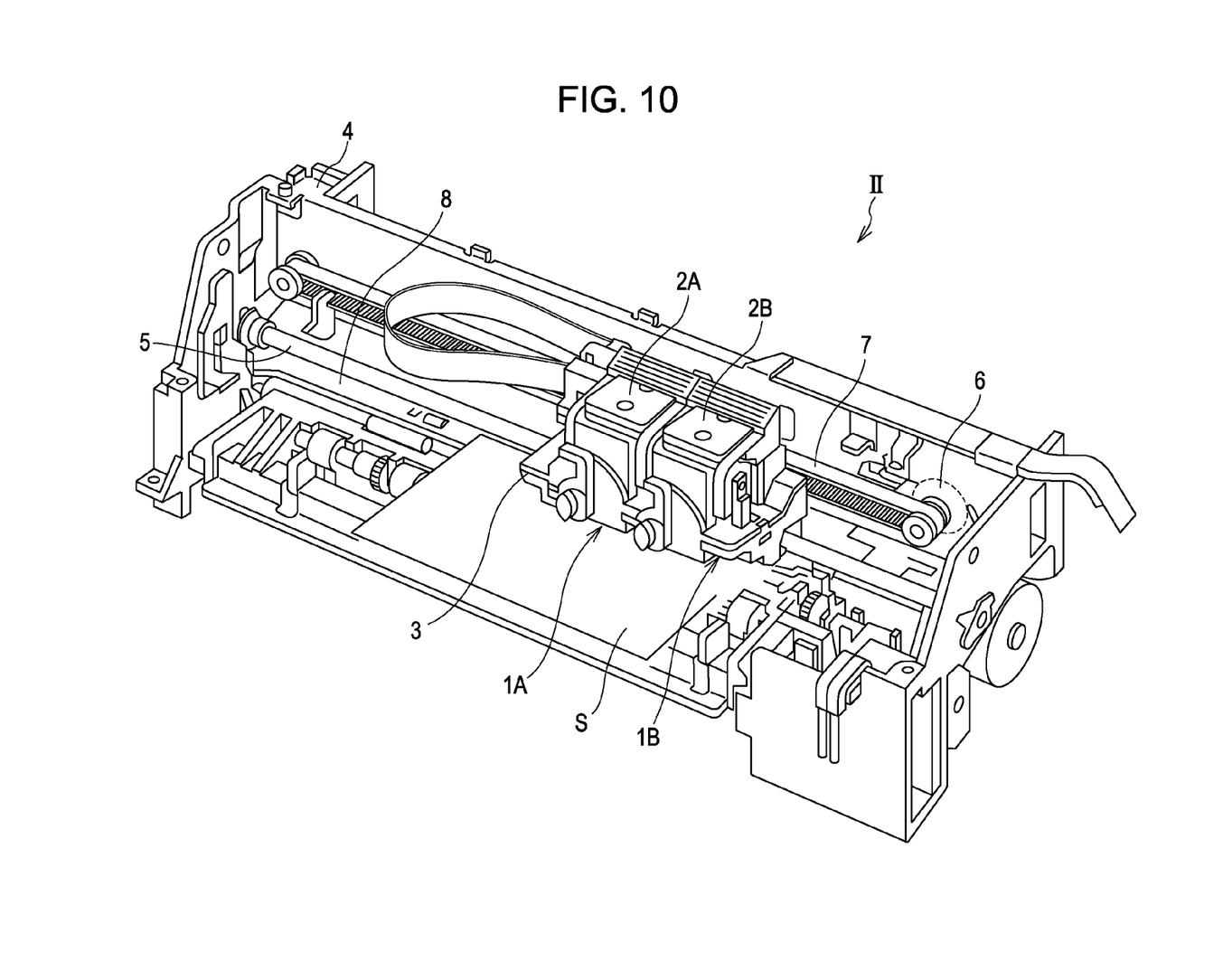
FIG. 10 illustrates a recording apparatus according to an embodiment of an aspect of the invention.

Incidentally, ink jet recording heads according to any one of these embodiments can be installed in ink jet recording apparatuses as a component of recording head units. Each recording head unit has an ink channel that communicates with an ink supply cartridge or any other kind of ink container. FIG. 10 illustrates an example of this type of ink jet recording apparatus.

An ink jet recording apparatus II has two recording head units 1A and 1B each equipped with the ink jet recording head I. These recording head units 1A and 1B carry detachable ink supply cartridges 2A and 2B, respectively. The main body 4 has a carriage shaft 5, along which the recording head units 1A and 1B can be freely moved on a carriage 3. In a typical constitution, the recording head unit 1A ejects a black-ink composition, whereas the recording head unit 1B ejects a color-ink composition.

Once a motor 6 is activated, the generated driving force is transmitted through gears (not illustrated in the drawing) and a timing belt 7 to the carriage 3. As a result, the carriage 3 and the recording head units 1A and 1B carried thereon move along the carriage shaft 5. At the same time, rollers or some other kind of feeding mechanism (not illustrated in the drawing) feeds a recording sheet S, which is then transported by a platen 8. The recording sheet S is a recording medium such as a sheet of paper. The platen 8 is a component for supporting the recording sheet S and extends along the carriage shaft 5 in the main body 4.

Although Embodiment 1 described above deals with an ink jet recording head as a typical liquid ejecting head, some aspects of the invention may cover many other kinds of liquid ejecting heads including ones not used with ink. Examples of liquid ejecting heads covered by such aspects of the invention include recording heads for printers and other kinds of image recording apparatus, colorant ejecting heads for manufacturing color filters for liquid crystal displays and other kinds of displays, electrode material ejecting heads for forming electrodes for organic EL displays, field emission displays (FEDs), and other kinds of displays, bioorganic substance ejecting heads for manufacturing biochips, and so forth.

Furthermore, some aspects of the invention may cover not only piezoelectric elements for ink jet recording heads and other types of liquid ejecting heads but also ones for other machines, for example, sonar and other kinds of ultrasonic devices, ultrasonic motors, infrared sensors, ultrasonic sensors, heat sensors, pressure sensors, pyroelectric sensors, acceleration sensors, gyroscopic sensors, and other kinds of sensors. Moreover, some aspects of the invention can be applied to ferroelectric memories and other kinds of ferroelectric elements, micro-liquid pumps, thin-film ceramic capacitors, gate insulating films, and other similar mechanisms.

What is claimed is:

1. A piezoelectric element comprising:
a first electrode;
a piezoelectric layer formed above the first electrode; and
a second electrode formed above the piezoelectric layer, wherein:
the piezoelectric layer is made of a piezoelectric material that comprises a perovskite compound and silicon dioxide;
wherein the perovskite compound further comprises bismuth manganite and barium titanate;
and wherein the content ratio of the silicon dioxide in the piezoelectric material is in the range of 0.5 to 5 mol %.

2. A liquid ejecting head comprising the piezoelectric element according to claim 1.

3. A liquid ejecting apparatus comprising the liquid ejecting head according to claim 2.

4. The piezoelectric element of claim 1, wherein the perovskite compound comprises BiFeO$_3$—BiMnO$_3$ and the content ratio of BiFeO$_3$—BiMnO$_3$ is greater than or equal to 60 mol %.

5. The piezoelectric element of claim 1, wherein the content ratio of Mn is between 1 mol % and 10 mol %, exclusive, relative to the total molar amount of Fe and Mn.

6. The piezoelectric element of claim 1, wherein the perovskite compound consists of BiFeO$_3$—BiMnO$_3$ and BaTiO$_3$, and wherein the perovskite compound is expressed by the following general formula:

$$x[Bi(Fe_{1-a},Mn_a)]O_3\text{-}y[BaTiO_3]$$

wherein: $0.60 \leq x \leq 1$, $0 \leq y \leq 0.40$, $x+y=1$, and $0.01 < a < 0.10$.

7. The piezoelectric element of claim 1, wherein the content ratio of SiO$_2$ is in the range of 1.5 to 2.5 mol %, inclusive.

8. The piezoelectric element of claim 1, wherein the content ratio of SiO$_2$ is in the range of 1 to 5 mol %.

9. The piezoelectric element of claim 1, wherein the content ratio of SiO$_2$ is in the range of 1.5 to 5 mol %.

* * * * *